United States Patent
Chang et al.

(10) Patent No.: US 6,531,266 B1
(45) Date of Patent: Mar. 11, 2003

(54) REWORK PROCEDURE FOR THE MICROLENS ELEMENT OF A CMOS IMAGE SENSOR

(75) Inventors: Chih-Kung Chang, Hsin-Chu (TW);
Kuang-Peng Lin, Hsin-Chu (TW);
Yu-Kung Hsiao, Tao-Yuan (TW);
Fu-Tien Weng, Taw-Yuan (TW);
Bii-Junq Chang, Hsin-Chu (TW);
Kuo-Liang Lu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 141 days.

(21) Appl. No.: 09/808,920

(22) Filed: Mar. 16, 2001

(51) Int. Cl.⁷ .......................... H01L 27/14; G02B 3/00; G02B 1/04
(52) U.S. Cl. ................... 430/321; 430/319; 430/329; 430/330
(58) Field of Search .................. 430/321, 319, 430/329, 330; 257/432, 440

(56) References Cited

U.S. PATENT DOCUMENTS

| 5,286,607 A | 2/1994 | Brown ................. 430/313 |
| 5,629,772 A | 5/1997 | Ausschnitt ............ 356/372 |
| 6,001,540 A | 12/1999 | Huang et al. ........... 430/321 |
| 6,002,540 A | 12/1999 | Cunningham et al. ... 360/77.04 |

FOREIGN PATENT DOCUMENTS

| JP | 3-190167 A | * | 8/1991 |
| JP | 6-138306 A | * | 5/1994 |
| JP | 11-242103 A | * | 9/1999 |

* cited by examiner

Primary Examiner—John A. McPherson
(74) Attorney, Agent, or Firm—George O. Saile; Stephen B. Ackerman

(57) ABSTRACT

A process for reworking a non-reflowed, defective microlens element shape, of an image sensor device, without damage to an underlying spacer layer, or to underlying color filter elements, has been developed. The non-reflowed, microlens element shape, if defective and needing rework, is first subjected to a high energy exposure, converting the non-reflowed, microlens element shape to a acid type, microlens shape, then removed using a base type developer solution. Prior to formation of a reworked microlens element shape a baking cycle is employed to freeze, or render inactive, any organic residue still remaining on the surface of the spacer layer, after the base type developer removal procedure. Formation of the reworked, microlens element shape, followed by an anneal cycle, results in the desired rounded, microlens element, on the underlying spacer layer.

16 Claims, 3 Drawing Sheets

REWORK PROCEDURE FOR THE MICROLENS ELEMENT OF A CMOS IMAGE SENSOR

BACKGROUND OF THE INVENTION (1) Field of the Invention

The present invention relates to methods used to fabricate semiconductor devices and more specifically to a method used to process a microlens element for a complimentary metal oxide semiconductor, (CMOS), image sensor device.

(2) Description of Prior Art

Microlens elements are employed as a component of an image sensor device to enhance device sensitivity. The microlens element is formed after formation of the color elements of the image sensor device, via application of a positive photosensitive, transparent organic layer, followed by a patterning procedure employing a photolithographic plate, conventional exposure and development procedures, using an alkaline developer. After definition of the microlens element a baking procedure is used to round the microlens element to increase focusing of incidence light. However rework of the microlens element, if needed as a result of the inability to initially define the desired microlens shape, can present difficulties. First the solvents used to remove the microlens element can damage the underlying color filter elements, or the spacer layer located overlying the color filter elements. In addition the solvents used to remove the microlens shapes can leave unwanted organic residues on the top surface of the spacer layer, subsequently resulting in flattened or mis-shaped, reworked microlens elements, after the bake cycle.

This invention will describe a novel procedure for removing a microlens element shape without damaging underlying materials such as the spacer layer, or the color filter elements. In addition this invention will offer a procedure that will alleviate the effect of any organic residues on the surface to be overlaid by the microlens elements, allowing rounded, microlens shapes be realized after a reflow procedure. Prior art such as Huang et al, in U.S. Pat. No. 6,001,540, describe a process for fabricating a microlens element, however that prior art does not offer the novel rework procedure, nor the novel pre-microlens formation, bake procedure, described in the present invention, allowing rounded, reworked microlens elements to be obtained.

SUMMARY OF THE INVENTION

It is an object of this invention to fabricate an image sensor device, featuring a microlens element.

It is another object of this invention to perform a rework procedure, if needed, featuring the removal of a defective microlens element shape from the top surface of the underlying spacer layer, by subjecting the defective microlens shape to a high photolithographic exposure energy, followed by removal of the exposed photoactive compound (PAC), using a base developer solution and de-ionized water.

It is still another object of this invention to perform a bake procedure prior to initiation of another microlens definition procedure, to "freeze" or alleviate, the effects of any organic residue, still remaining on the surface of the underlying spacer layer after the base developer removal procedure, allowing a subsequent rounded, reworked microlens element to be formed on the spacer layer, after the reflow procedure.

In accordance with the present invention a method for reworking a defective microlens element, of an image sensor device, is described. After formation of the photodiode components, and the color filter elements, of an image sensor device, a spacer layer is formed on the underlying color filter elements. Application of, and definition of, a photosensitive organic layer results in the formation of microlens elements, located on the top surface of the spacer layer. Prior to a reflow procedure, used to round the microlens elements, and to increase focusing properties of this element, if the desired shape of the pre-reflowed microlens element has not been obtained, a rework procedure is initiated. First a high energy exposure is used to convert the photoactive compound (PAC), microlens shape to an acid containing organic shape, followed by removal in a base developer solution. Next a frozen bake procedure is performed to cure, or freeze, any organic phororesist residuals, still remaining on the surface of the spacer layer after the base developer removal procedure. Application of, and definition of another photosensitive organic layer results in the attainment of the reworked microlens element shape. A reflow procedure is then employed to create the desired microlens, rounded shape.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
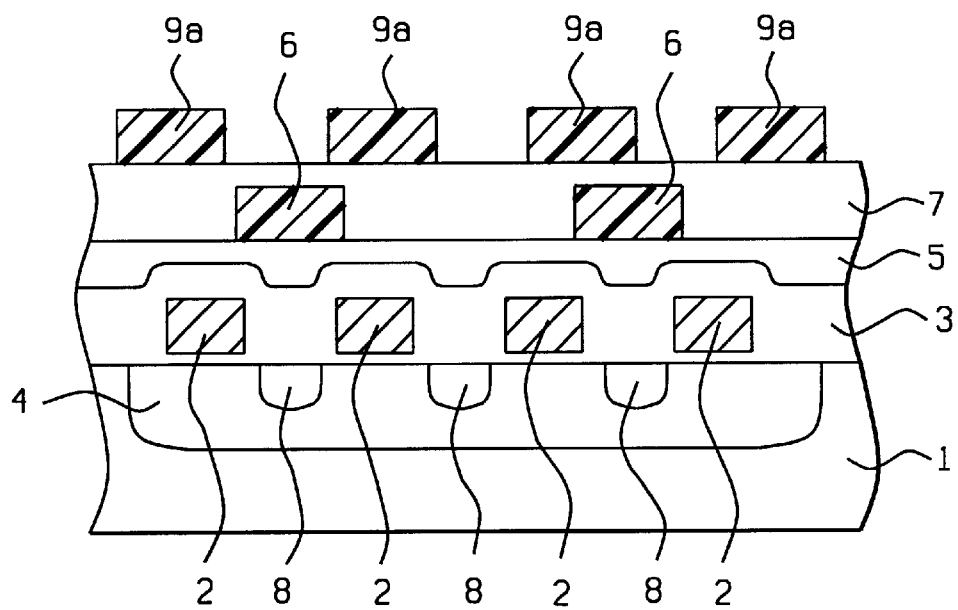
FIGS. 1–6, which schematically, in cross-sectional style, show the key stages used to rework, or remove, a defective microlens element shape from the surface of a spacer layer, followed by the successful formation of a reworked, microlens element, located on the top surface of a spacer layer, which in turn overlays the color filter elements of a image sensor device.

The method of reworking a defective microlens element shape, of an image sensor device, featuring a high energy exposure and a developer removal procedure, as well as featuring a bake step performed prior to re-applying the microlens layer, will now be described in detail. FIG. 1, schematically shows an image sensor device, prior to removal of defective, non-reflowed microlens elements 9a. Photodiodes are comprised of P+ region 8, formed via ion implantation of boron or $BF_2$ ions, in N well region 4, which in turn is formed via ion implantation of arsenic or phosphorous ions, into a P type, on semiconductor substrate 1. This is schematically shown in FIG. 1. Polysilicon, or metal gate structures 2, located on an underlying gate insulator layer, (not shown in the drawings, are next formed. Passivation layer 3, comprised of silicon nitride, obtained via plasma enhanced chemical vapor deposition, (PECVD), at a thickness between about 2000 to 10000 Angstroms, is next deposited, followed by the application of planarization layer 5, comprised of a high transmittance, negative type photoresist layer, accomplished via conventional coating, exposure and development procedures. This is schematically shown in FIG. 1.

Color filter elements 6, comprised of green, red, and blue pixel elements, are formed via application of a negative photosensitive, organic layer, followed by a patterning procedure. The patterning procedure is achieved via conventional photolithographic exposure and development procedures, using a photolithographic plate as a mask. This is shown schematically in FIG. 1. After definition of each color filter element 6, a hard plate baking is performed at a temperature between about 200 to 250° C. This is followed by formation of spacer layer 7, comprised of a photosensitive, transparent photoresist layer, or a silicon oxide layer, obtained via application of, or deposition of the spacer layer, than subjected to a planarizing CMP procedure to obtain a smooth top surface for spacer layer 7. Spacer layer 7, is formed to a thickness between about 10000 to 20000, via conventional coating procedures if spacer layer 7, is comprised of photoresist, (a negative type, high transmittance photoresist), or via a PECVD procedure if spacer layer 7, is comprised of silicon oxide. This is followed by the definition of microlens elements 9a, on the smooth top surface of spacer layer 7. Microlens elements 9a, are formed via application of a positive, photosensitive, transparent organic layer, followed by a patterning procedure employing a photolithographic plate, conventional exposure and development procedures, using an alkaline developer. This is also shown schematically in FIG. 1. If the desired image or shape of the microlens elements is achieved, a baking procedure is used to round the microlens element to increase focusing of incidence light. However if the desired image or shape of microlens elements 9a, is not achieved, a critical rework procedure has to be performed, prior to baking of the microlens elements.

Figure 2:
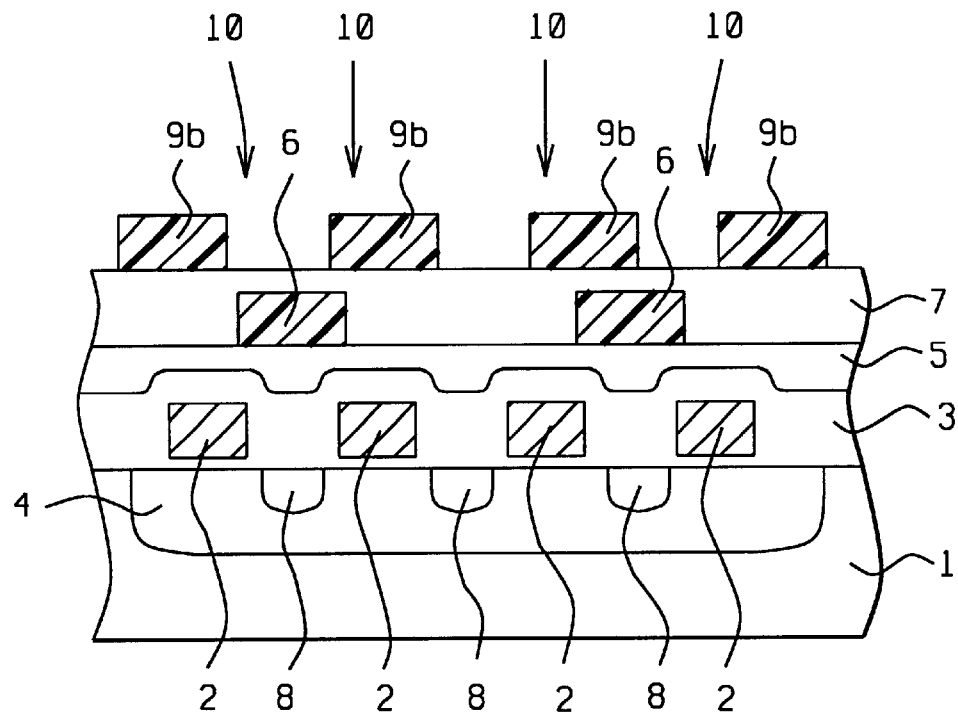
Figure 3:
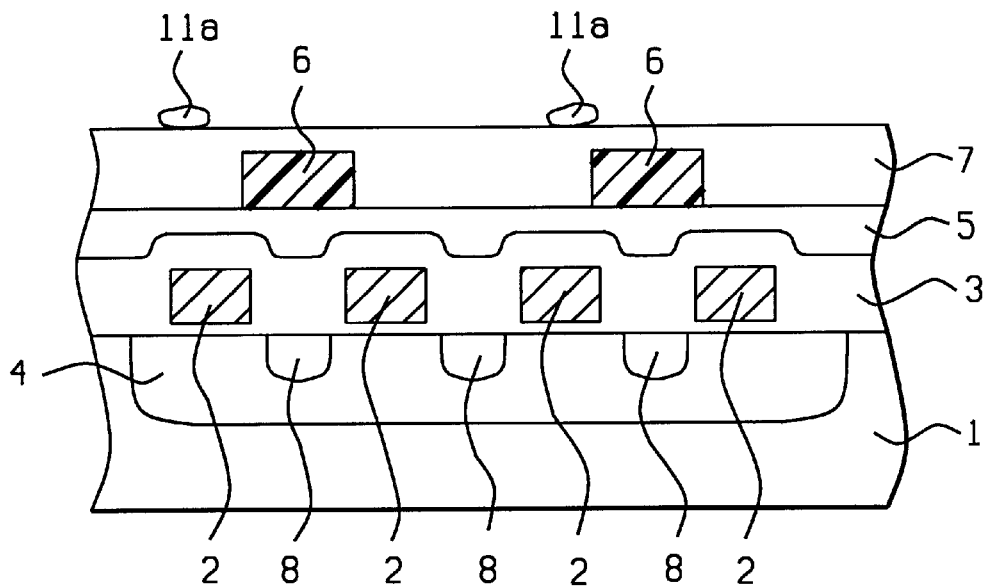

The initiation of the microlens element, rework procedure, shown schematically in FIG. 2, entails a high energy, photolithographic exposure 10, of microlens element shapes 9a, at an energy between about 300 to 1200 millijoules (mj), converting microlens element shapes 9a, to acid type, microlens element shapes 9b, which will be soluble in a base type, developer solution. The high energy, photolithographic exposure of microlens element shapes 9a, can be performed using a photolithographic mask to allow only specific regions of the image sensor device to be exposed, or if desired the entire wafer can be subjected to the high energy, photolithographic exposure, thus reducing process complexity and cost. A base developer solution is next used to remove acid type, microlens element shapes 9b, from the top surface of spacer layer 7. This is schematically shown in FIG. 3. Thus the rework procedure, featuring high energy exposure and development, is performed without the use of extraordinary solvents such as acetone, which can damage underlying color filter elements 6, if exposed through defects in spacer layer 7. In addition the negative type, color filter elements, even if exposed through defects in spacer layer 7, still would not become soluble in a base developer, as a result of the high energy exposure. This rework procedure can however still result in organic residues 11a, insoluble in the base developer solution, residing on the top surface of spacer layer 7. This is schematically shown in FIG. 3.

Figure 4:
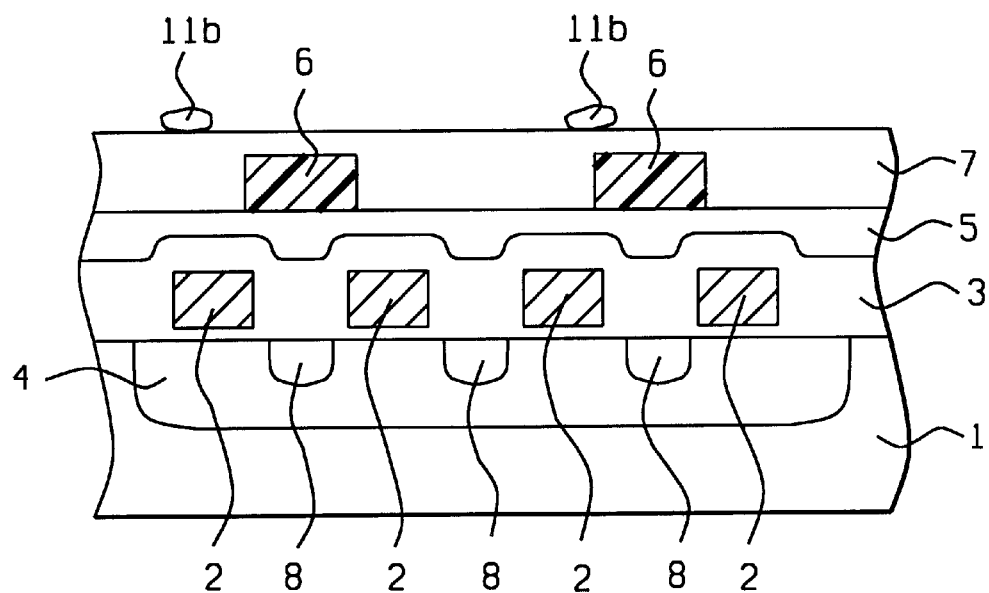

If resist, or organic residues 11a, are not addressed, newly defined, reworked microlens element shapes, when subjected to the needed reflow procedure, will result in non-rounded, flat, microlens elements, which will not provide the needed focusing acuity, supplied by reflowed, rounded microlens elements. Therefore a second part of the microlens rework process, entailing the conversion of resist residue 11a, to benign organic shapes 11b, which will not interfere with the attainment of rounded microlens elements after reflow, is next addressed. A bake procedure, performed at a temperature between about 160 to 200° C., for a time between about 5 to 15 min, is used to convert resist residues 11a, to benign type, organic residues 11b, located on the top surface of spacer layer 7. This is schematically shown in FIG. 4.

Figure 5:
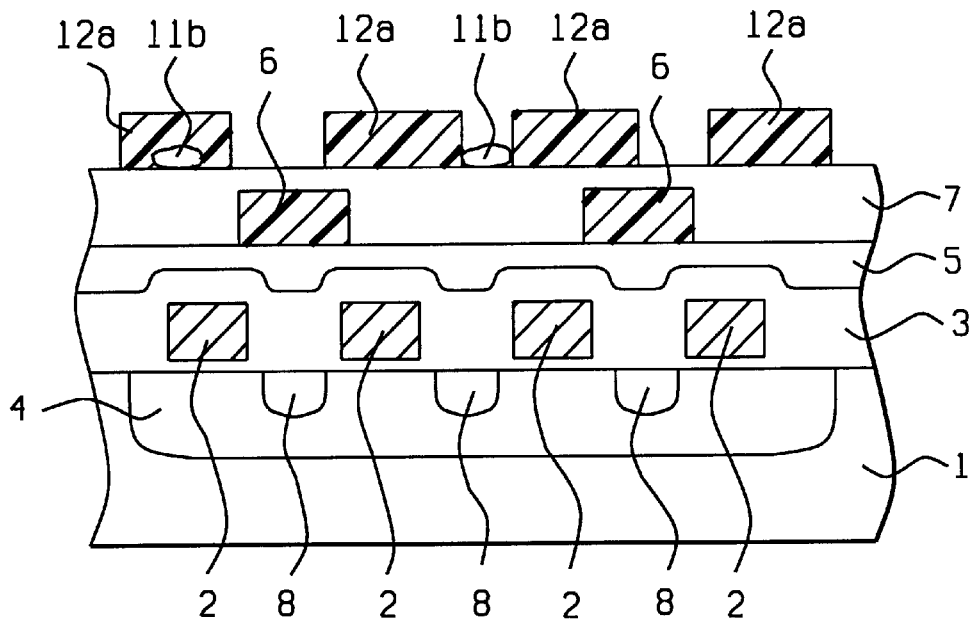
Figure 6:
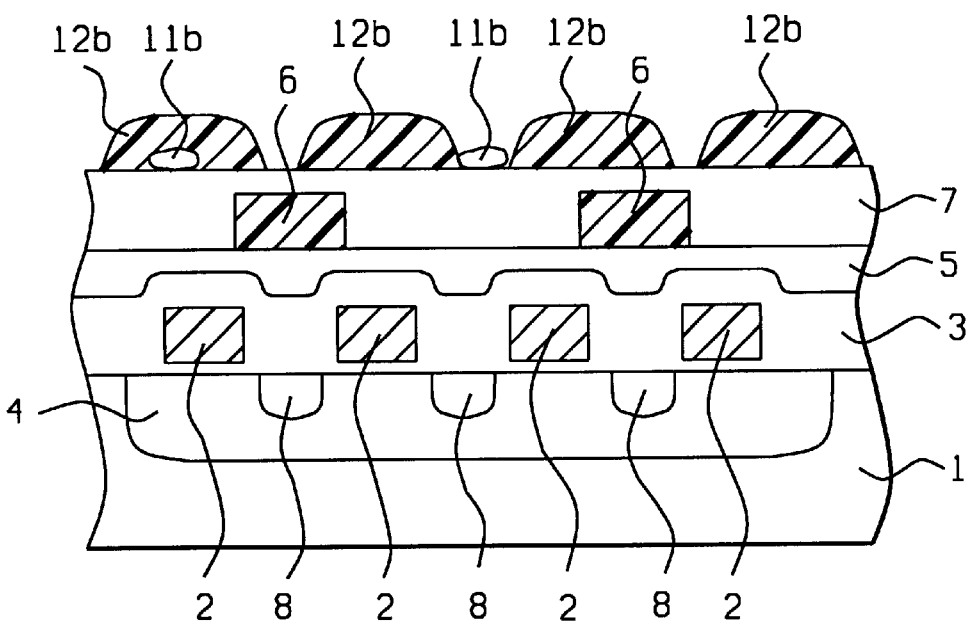

The attainment of the reworked microlens element shapes are next addressed, and schematically shown in FIGS. 5–6. Microlens element shapes 12a, are again formed via application of a positive, photosensitive, transparent organic layer, followed by a patterning procedure employing a photolithographic plate, conventional exposure, and development procedures, using an alkaline developer. This is schematically shown in FIG. 5. A first benign organic residue 11b, is shown encapsulated by a microlens element shape 12a, while a second benign organic residue is shown located between microlens element shapes 12a. The critical reflow procedure is next performed at a temperature between about 150 to 170° C., for a time between about 5 to 15 min, resulting in rounded, microlens elements 12b, shown schematically in FIG. 6. The desired rounded shape of microlens elements 12b, increases the focusing of incidence light. The ability to render organic residues 11b, benign, as a result of the frozen bake cycle, prevented the unwanted flattening of microlens elements 12b.

While this invention has been particularly shown and described with reference to, the preferred embodiments thereof, it will be understood by those skilled in the art that various changes in form and details may be made without departing from the spirit and scope of this invention.

What is claimed is:

1. A method of reworking a microlens element shape for an image sensor device, on a semiconductor substrate, comprising the steps of:

providing a photodiode element in said semiconductor substrate, with color filter elements located overlying said photodiode element;

providing a spacer layer on said color filter elements, and providing a non-reflowed microlens element on said spacer layer;

performing a high energy exposure procedure to convert said non-reflowed microlens element to a acid type, microlens shape;

removing said acid type, microlens shape from top surface of said spacer layer;

performing a bake procedure to convert any organic residue of said acid type, microlens shape, to a non-reactive organic residue;

forming reworked, microlens shape on said spacer layer, and on any said nonreactive organic residue; and performing an anneal procedure to convert said reworked, microlens shape, to a rounded microlens element.

2. The method of claim 1, wherein said spacer layer is a negative type, high transmittance photoresist layer, obtained via conventional coating procedures, to a thickness between about 10000 to 20000 Angstroms.

3. The method of claim 1, wherein said non-reflowed microlens element is obtained via application of a positive, photosensitive transparent organic layer, followed by a patterning procedure employing a photolithographic plate, conventional exposure, and development procedures, using an alkaline developer.

4. The method of claim 1, wherein said acid type microlens shape is obtained via a photolithographic exposure, performed to said non-reflowed microlens element, at an energy between about 300 to 1200 millijoules.

5. The method of claim 1, wherein acid type, microlens shape is removed from the top surface of said spacer layer via use of a base type developer solution.

6. The method of claim 1, wherein said bake procedure, used to convert any organic residue of said acid type, microlens shape, to a non-reactive organic residue, is performed at a temperature between about 160 to 200° C., for a time between about 5 to 15 min.

7. The method of claim 1, wherein said reworked, microlens shape is obtained via application of a positive, photosensitive transparent organic layer, followed by a patterning procedure employing a photolithographic plate, conventional exposure, and development procedures, using an alkaline developer.

8. The method of claim 1, wherein said anneal procedure, used to convert said reworked, microlens shape, to a rounded microlens element, is performed at a temperature between about 150 to 170° C., for a time between about 5 to 15 min.

9. A method of forming an image sensor device, on a semiconductor substrate, featuring a microlens rework procedure, comprising the steps of:

forming photodiode elements in said semiconductor substrate;

forming a passivation layer on said photodiode elements;

forming a planarization layer on said passivation layer;

forming color filter elements;

forming a spacer layer on said color filter elements;

forming a first microlens element shape on said spacer layer;

performing a high energy exposure procedure to convert said first microlens element shape to a acid type, microlens element shape;

removing said acid type, microlens element shape from top surface of said spacer layer, leaving organic residue of said acid type, microlens element shape, on the top surface of said spacer layer;

performing a frozen bake procedure to convert said organic residue of said acid type, microlens element shape, to a non-reactive organic residue;

forming a second microlens element shape on said spacer layer, and on any said non-reactive organic residue; and performing an reflow procedure to convert said second microlens element shape, to a rounded microlens element.

10. The method of claim 9, wherein said spacer layer is a negative type, high transmittance, photoresist layer, obtained via coating procedures, to a thickness between about 10000 to 20000 Angstroms.

11. The method of claim 9, wherein said first microlens element shape is obtained via application of a positive, photosensitive transparent organic layer, followed by a patterning procedure employing a photolithographic plate, conventional exposure, and development procedures, using an alkaline developer.

12. The method of claim 9, wherein said high energy exposure procedure used to convert said first microlens element shape to said acid type, microlens element shape, is performed at an energy between about 300 to 1200 millijoules.

13. The method of claim 9, wherein said acid type, microlens element shape is removed from the top surface of said spacer layer via use of a base type developer solution.

14. The method of claim 9, wherein said frozen bake procedure, used to convert said organic residue of said acid type, microlens element shape, to a non-reactive organic residue, is performed at a temperature between about 160 to 200° C., for a time between about 5 to 15 min.

15. The method of claim 9, wherein said second microlens element shape is obtained via application of a positive, photosensitive, transparent organic layer, followed by a patterning procedure employing a photolithographic plate, conventional exposure, and development procedures, using an alkaline developer.

16. The method of claim 9, wherein said reflow procedure, used to convert said second microlens element shape to a rounded microlens element, is performed at a temperature between about 150 to 170° C., for a time between about 5 to 15 min.

* * * * *